(12) United States Patent
Hasegawa

(10) Patent No.: US 6,773,687 B1
(45) Date of Patent: Aug. 10, 2004

(54) EXHAUST APPARATUS FOR PROCESS APPARATUS AND METHOD OF REMOVING IMPURITY GAS

(75) Inventor: Toshio Hasegawa, Nakakoma-gun (JP)

(73) Assignee: Tokyo Electron Limited, Tokyo (JP)

( * ) Notice: Subject to any disclaimer, the term of this patent is extended or adjusted under 35 U.S.C. 154(b) by 112 days.

(21) Appl. No.: 09/718,483

(22) Filed: Nov. 24, 2000

(30) Foreign Application Priority Data

Nov. 24, 1999 (JP) .......................................... 11-333433

(51) Int. Cl.$^7$ ............................................. B01D 53/34
(52) U.S. Cl. .................. 423/210; 423/240 R; 427/99; 427/124; 438/680; 438/681
(58) Field of Search .............................. 423/210, 240 R; 438/680, 681, 905; 427/99, 124

(56) References Cited

U.S. PATENT DOCUMENTS

| | | | | |
|---|---|---|---|---|
| 3,806,583 | A | * | 4/1974 | Dewell ......................... 423/262 |
| 5,788,747 | A | * | 8/1998 | Horiuchi et al. ............... 95/288 |
| 5,904,757 | A | * | 5/1999 | Hayashi et al. ............... 96/416 |
| 6,149,729 | A | * | 11/2000 | Iwata et al. ................... 118/715 |
| 6,156,107 | A | * | 12/2000 | Hayashi et al. ............... 96/416 |
| 6,241,955 | B1 | * | 6/2001 | Alvarez, Jr. .................. 423/210 |
| 6,334,928 | B1 | * | 1/2002 | Sekine et al. ................. 156/345 |
| 6,402,806 | B1 | * | 6/2002 | Schmitt et al. ................ 75/414 |
| 2003/0113986 | A1 | * | 6/2003 | Sakamoto et al. ........... 438/584 |

FOREIGN PATENT DOCUMENTS

| | | |
|---|---|---|
| JP | 9-202973 A | 8/1997 |
| JP | 10-140357 A | 5/1998 |
| JP | 11-1773 A | 1/1999 |

* cited by examiner

Primary Examiner—Wayne A. Langel
(74) Attorney, Agent, or Firm—Oblon, Spivak, McClelland, Maier & Neustadt, P.C.

(57) ABSTRACT

In processes for coating objects, such as semiconductor wafers, with a film of metal, such as titanium metal, a metal-containing compound, such as $TiCl_4$, is injected into a chamber containing the object and a portion of the metal-containing compound reacts to provide the film of metal on the object and a gas containing by-products, such as unreacted $TiCl_4$ and $TiCl_x$ (x<4), which is discharged out of the chamber and passed through a trap mechanism and an eliminator for the removal of the by-products out of the gas. The by-products have relatively high vapor pressures, making them difficult to trap. The Applicants have found that by adding a reagent, such as water, $O_2$ or $NH_3$, into the exhaust gas at a location upstream of the trap mechanism and eliminator, the reagent reacts with the by-product in the gas to produce a compound, such as $TiCl_4 \cdot 2NH_3$, which has a significantly lower vapor pressure than the by-product and can be removed in the trap mechanism.

12 Claims, 7 Drawing Sheets

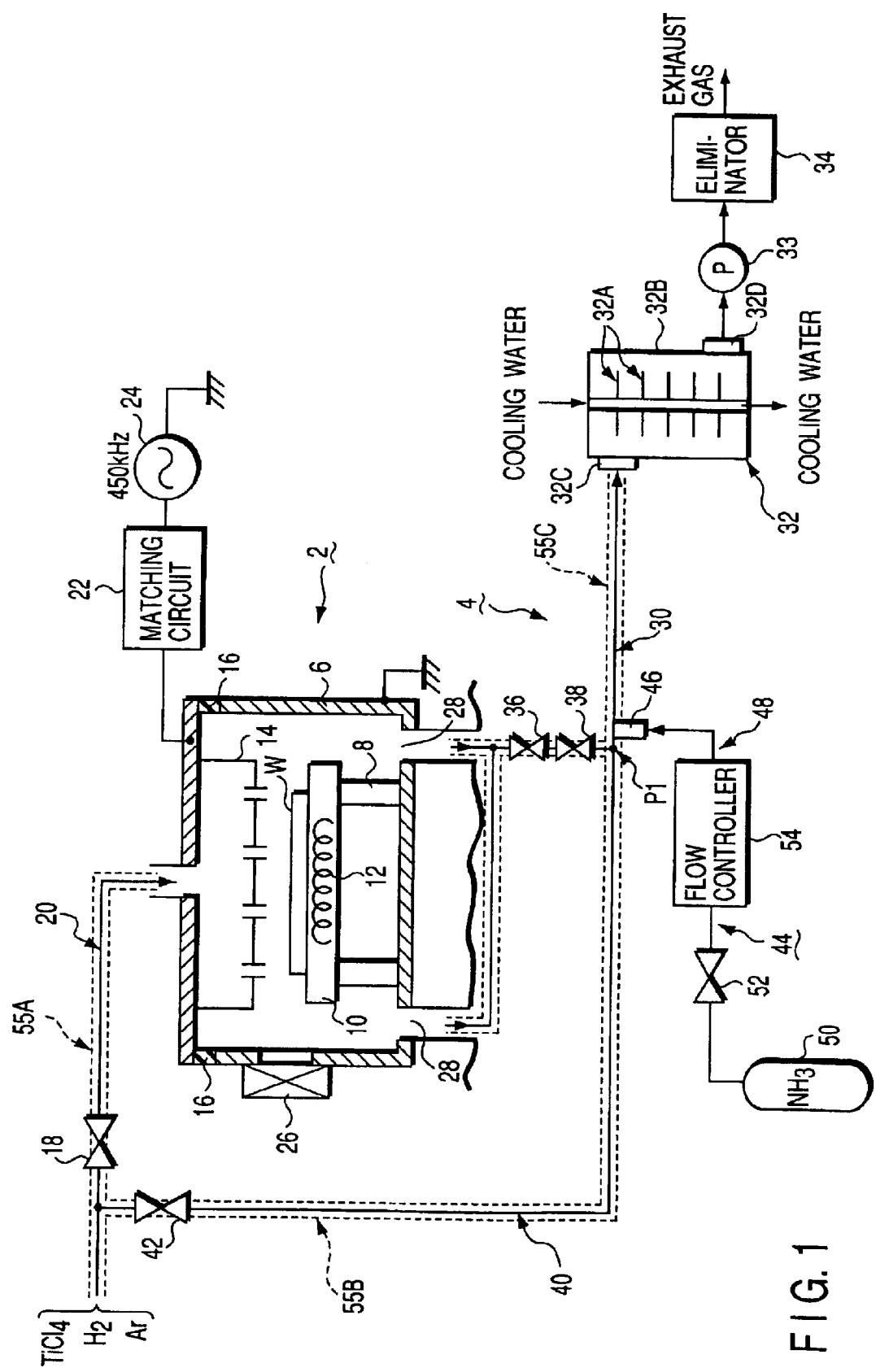
F I G. 1

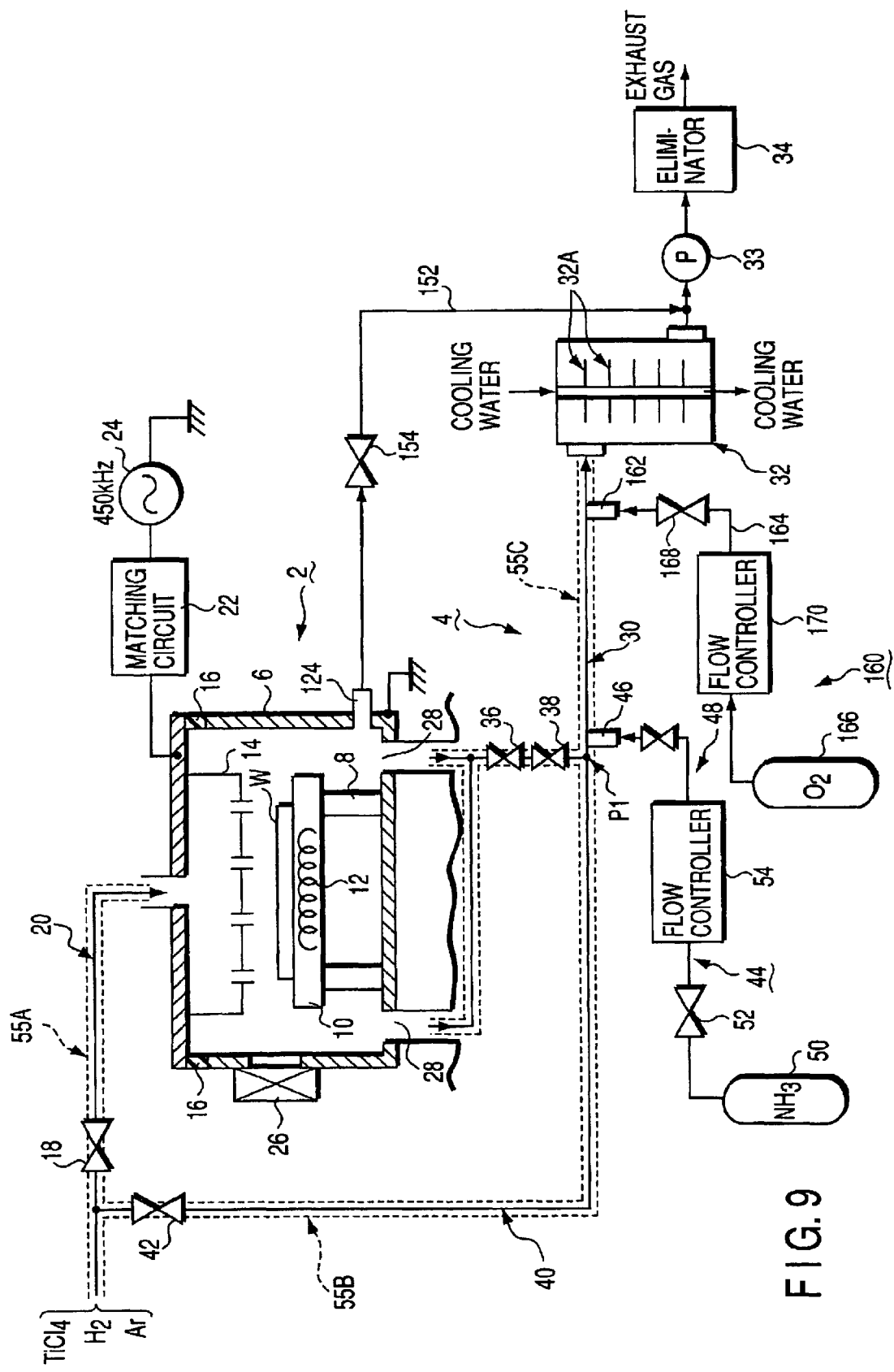
F I G. 9

EXHAUST APPARATUS FOR PROCESS APPARATUS AND METHOD OF REMOVING IMPURITY GAS

CROSS-REFERENCE TO RELATED APPLICATIONS

This application is based upon and claims the benefit of priority from the prior Japanese Patent Application No. 11-333433, filed Nov. 24, 1999, the entire contents of which are incorporated herein by reference.

BACKGROUND OF THE INVENTION

The present invention relates to an exhaust apparatus for a process gas, which is used in combination with a process apparatus for forming a layer on an object to be processed using the process gas, and relates to a method of removing an impurity gas (unprocessed gas, non-reacted process gas) formed by a process gas.

In general, to form an integrated circuit, such as an IC, or a logic device, a step of depositing a desired thin film on the surface of an object to be processed, such as a semiconductor wafer, glass substrate or LCD substrate, and a step of etching the deposited film to a desired pattern are repeatedly carried out.

With regard to the film deposition step, for example, a thin silicon film, a thin film of silicon oxide or nitride, a thin metal film, a thin film of metal oxide or nitride, or the like is formed on a to-be-processed object by reacting a predetermined process gas (source gas) in a process vessel. It is known that an excess reaction by-product is produced at the same time as the reaction for film deposition and the reaction by-product, and a non-reacted process gas is discharged together with an exhaust gas.

The reaction by-product and non-reacted process gas, if discharged directly in an atmosphere, would cause an environmental pollution or the like. To prevent such pollution, an exhaust apparatus is connected to the process vessel. The exhaust apparatus has a trap mechanism provided in an exhaust gas system that extends from the process vessel to trap and removes a reaction by-product or non-reacted process gas or the like contained in the exhaust gas.

Various structures have been proposed for the trap mechanism in accordance with the characteristics of the reaction by-product or the like that should be trapped and removed. To eliminate a reaction by-product which is liquefied or solidified and condensed at an ordinary temperature, for example, a trap mechanism has multiple fins provided in a casing which has an inlet port and an exhaust port for the exhaust gas. The fins are orderly arranged in the flow direction of the exhaust gas and trap a reaction by-product or the like contained in the exhaust gas on their surfaces as the exhaust gas passes between the fins. Such an apparatus typically cools the fins with a cooling fluid or the like in order to improve the trapping efficiency.

A description will now be given of the case where a $TiCl_4$ (titanium tetrachloride) gas of a high-melting point metal halogen compound is used as a source gas to form a Ti metal film on a semiconductor wafer. $H_2$ gas is used as a source gas in addition to the $TiCl_4$ gas. The $H_2$ gas is activated by plasma in the process container under an Ar gas atmosphere and reduced with hydrogen, thus depositing a Ti film on the surface of the semiconductor wafer. At this time, $TiCl_x$ (x<4) is produced as a reaction by-product, and a non-reacted $TiCl_4$ gas is present in the process vessel. The $TiCl_x$ gas and $TiCl_4$ gas or the like flow out of the exhaust apparatus in the form of impurities in the exhaust gas. Because the $TiCl_x$ gas and $TiCl_4$ gas or the like are impurity gases that would cause air pollution or the like, they should be trapped by the aforementioned trap mechanism in the exhaust apparatus.

Because the aforementioned impurity gases, such as the $TiCl_4$ gas or a non-reacted gas and the $TiCl_x$ gas or a reaction by-product, have relatively high vapor pressures, it is very difficult to completely trap and eliminate those gases in the trap mechanism even if the interior of the trap mechanism is cooled as mentioned above. This may result in insufficient trapping. In this respect, an eliminator is provided at the downstream of the trap mechanism to completely eliminate the impurity gas that has passed through the trap mechanism. Such an eliminator is complicated and should be inspected frequently, leading to a higher running cost and a shorter service life. To solve this problem, the eliminator should have a very large capacity, which inevitably enlarges the whole apparatus and increases the cost. Such a shortcoming is common to various process apparatuses which use a high-melting point metal halogen compound gas such as $TiCl_4$, $WF_6$ or $(Ta(OE)_5)_2$ (pentoethoxy tantalum).

A method of depositing a TiN film is known as another process method which uses $TiCl_4$ gas. This method will be explained with reference to the case where $TiCl_4$ (titanium tetrachloride) gas of a high-melting point metal halogen compound is used as a source gas to form a TiN film. $NH_3$ gas is used as a source gas in addition to the $TiCl_4$ gas and both gases are reacted in a reactor to deposit a TiN film on the surface of a semiconductor wafer. At this time, $NH_4Cl$ and $TiCl_4(NH_3)_n$ (n: a positive integer) are produced as reaction by-products, and non-reacted $TiCl_4$ gas is also present in the reactor. The gas components flow out of the reactor in the form of impurities in the exhaust gas and are trapped by the aforementioned trap mechanism and/or eliminator.

Because an unnecessary film which causes particles sticks on the inner wall of the process chamber of the process apparatus or the surface of a structure inside the vessel as the film deposition is carried out, cleaning is executed as needed, which regularly or irregularly supplies a cleaning gas into the process chamber to eliminate the unnecessary film. In this case, various kinds of fluorohalogen-based gases, such as $ClF_3$ gas, are used as cleaning gases. The $ClF_3$ gas removes the unnecessary film stuck on the inner wall or the like of the process chamber and is reacted with a reaction by-product of $TiCl_4(NH_3)_n$, thus yielding another reaction by-product, such as $TiF_4(NH_3)_n$.

As $NH_4Cl$, $TiCl_4(NH_3)_n$, $TiF_4(NH_3)_n$, etc. are sequentially stored in the trap mechanism as reaction by-products, the trap mechanism is regularly or irregularly detached from a vacuum exhaust system, opening the interior so that the reaction by-products are cleaned out. At the time the trap mechanism is released in an atmosphere, $NH_4Cl$ hardly makes a problem because it is relatively stable. However, $TiCl_4(NH_3)_n$ or $TiF_4(NH_3)_n$ produce HCl gas, HF gas and $NH_3$ gas, harmful to human bodies, as indicated by the following formulas (1), (2) if reacting oxygen in the air. Some countermeasures are therefore demanded.

$$TiCl_4(NH_3)_n + O_2 \rightarrow TiO_2 + HCl + NH_3 \quad (1)$$

$$TiF_4(NH_3)_n + O_2 \rightarrow TiO_2 + HF + NH_2 \quad (2)$$

BRIEF SUMMARY OF THE INVENTION

Accordingly, it is an object of the present invention to provide an exhaust apparatus for a process apparatus and an impurity-gas removing method, which can sufficiently remove a non-reacted source gas, its reaction by-product or the like.

It is another object of this invention to provide an impurity-gas removing method and an exhaust apparatus for a process apparatus, which can stabilize a reaction by-product trapped by a trap mechanism.

To achieve the above objects, an exhaust apparatus according to one aspect of this invention comprises an exhaust pipe to be connected to an exhaust port of a process apparatus; a trap mechanism disposed in the exhaust pipe, for removing an impurity gas contained in an exhaust gas, is exhausted from the process apparatus; reaction-gas supply means provided in the trap mechanism and/or in the exhaust pipe at an upstream of the trap mechanism, for feeding a reaction gas which is reacted with the impurity gas in at least one of the trap mechanism and the exhaust pipe to lower a vapor pressure; and exhaust-gas discharging means provided in the exhaust pipe at a downstream of the trap mechanism, for discharging the exhaust gas from the process apparatus outside via the exhaust pipe.

As the reaction gas is fed from the reaction-gas supply means into the trap mechanism and/or the exhaust pipe at the upstream of the trap mechanism reach, a reaction by-product whose vapor pressure is lower than that of the impurity gas is formed. It is therefore possible to easily condense and solidify the impurity gas in the trap mechanism and trap the gas there.

It is preferable that the reaction-gas supply means should be located in the exhaust pipe near the exhaust port of the process apparatus so that mixed diffusion of the reaction gas is accelerated while the exhaust gas reaches the trap mechanism, an accelerates the reaction, making it possible to trap and eliminate more reliably an impurity gas such as a process.

Oxidative-gas supply means for feeding an oxidative gas for reacting with and oxidizing a reaction by-product in the trap mechanism may be provided in the trap mechanism or a portion of the exhaust pipe at the upstream of the trap mechanism.

This structure can oxidize and stabilize an unstable reaction by-product by feeding an oxidative gas to the exhaust system before the trap mechanism is detached from the exhaust system. This makes it possible to detach the trap mechanism from the exhaust system and clean the inside of the trap mechanism while safely keeping the trap mechanism open.

In this case, the exhaust apparatus may comprise a bypass pipe connected to the process apparatus to bypass the trap mechanism.

In this case, it is preferable that, when the oxidative gas is made to contact the reaction by-product in the trap mechanism, the process apparatus is evacuated with a large inverse diffusion coefficient though a bypass pipe provided to bypass the trap mechanism. This prevents the reverse diffusion of the oxidative gas to the deposition apparatus, thus preventing, for example, a precoat film or the like formed on the inner wall or the like of process vessel of the process apparatus from being altered by the oxidative gas.

Further, it is preferable that, in the step of stabilizing the reaction by-product, a step of sealing the oxidative gas at a pressure higher than that needed at a time of evacuating the trap mechanism and a step of exhausting the sealed oxidative gas should be sequentially repeated several times.

As the oxidative gas is sealed inside the trap mechanism under a pressure higher than the pressure involved at the time of evacuating the trap mechanism, the reaction of the reaction by-product with the oxidative gas is accelerated. This ensures faster stabilization of the reaction by-product.

The reaction gas may be at least one of an ammonia gas, oxygen-containing gas, vapor, and an inert gas mixed with at least one of them.

Preferably, the process gas may be a high-melting point metal compound gas such as titanium-containing gas (e.g. $TiCl_n$), tungsten-containing gas (e.g. $WF_n$), tantalum-containing gas (e.g. $TaCl_n$, $TaBr_n$, organic Ta) and silicon-containing gas (e.g. $SiH_2$, $SiH_nCl(2n+2)$-$SiCl_m$) (n: a positive integer, and m+n=4).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view schematically illustrating an exhaust apparatus according to one embodiment of the present invention which is combined with a process apparatus;

FIG. 9 is a diagram schematically illustrating an exhaust apparatus according to a further embodiment of this invention which is combined with a process apparatus.

DETAILED DESCRIPTION OF THE INVENTION

One embodiment of an exhaust apparatus for a process apparatus such as a film forming apparatus and an impurity-gas removing method according to the present invention will be described below with reference to the accompanying drawings.

Figure 2:
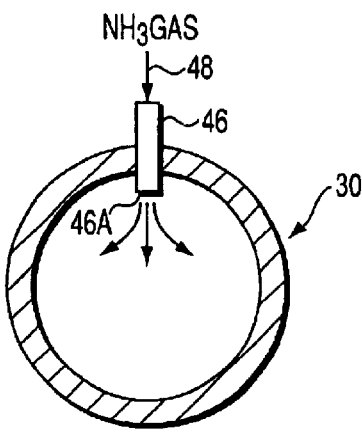
FIG. 2 is a cross-sectional view of an exhaust pipe, showing the attachment of a reaction-gas injection nozzle.

FIG. 1 shows an exhaust apparatus for a process apparatus according to this invention. FIG. 2 is a cross-sectional view of an exhaust pipe, showing the attachment of a reaction-gas injection.

The following description of this embodiment will be given of the case where a Ti film is deposited on the surface of a semiconductor wafer (including the surface of a film or layer formed on the semiconductor wafer), which is an object to be processed by plasma CVD (Chemical Vapor Deposition) using a $TiCl_4$ gas (i.e., a high-melting point metal halogen compound gas) as a high-melting point metal compound gas.

As shown in FIG. 1, the film deposition system comprises mainly a process apparatus 2 which actually deposits a Ti film on a semiconductor wafer W and an exhaust apparatus 4 which vacuums inside the process apparatus 2.

To begin with, the process apparatus 2 will be discussed. The process apparatus 2 has a cylindrical process vessel 6 of, for example, aluminum, which is grounded. Provided in the process vessel 6 is a susceptor 10 which is supported on the bottom by conductive support columns 8 and on which the semiconductor wafer W is to be placed. The susceptor 10 is made of a conductive material, such as Ni, and serves as a lower electrode, or a non-conductive material such as AlN. A resistance heating heater 12 for heating the semiconductor wafer W is embedded in the susceptor 10.

A shower head 14 which feeds as a source or process gas, into the process vessel 6 is provided on the ceiling of the process vessel 6 though an insulator 16. A common gas supply pipe 20 provided with a supply-side open-close valve 18 is connected to the shower heat 14, and to gas sources (not shown) for necessary gases, such as a $TiCl_4$ gas, $H_2$ gas and Ar gas, via a flow controller and open-close valves. The gases can therefore be supplied into the process vessel 6 with their flow rates controlled. Because such a gas supply mechanism is generally well known, it is not particularly illustrated. Alternatively, gas supply pipes from the several gas sources may be directly connected to the shower head 14 to feed the gases several independently into the process vessel 6.

The shower head 14, which serves as an upper electrode, is connected to a high-frequency power supply 24 of, for example, 450 kHz via a matching circuit 22, and so that the high frequency from the supply 24 generates the plasma of the process gas between the susceptor 10 and the shower head 14.

A gate valve 26, through which the loading and unloading of the wafer w are carried out, is provided in the side wall of the process vessel 6. A plurality of exhaust ports 28 (one may be feasible) are provided in the peripheral portion of the bottom of the process vessel 6.

The exhaust apparatus 4 that is connected to the deposition apparatus 2 of the above-described structure has an exhaust pipe 30 of stainless steels. The pipe 30 has an inner diameter of about 10 cm and is connected at one end to the exhaust ports 28. A trap mechanism 32 for removing an impurity gas in the exhaust gas, a vacuum pump 33 which evacuates the process vessel 6, and an eliminator 34 which completely eliminates the residual impurity gas in the exhaust gas are arranged in the order mentioned, in the exhaust pipe 30 toward the downstream.

Disposed at the uppermost stream side of the exhaust pipe 30 (considerably upstream of the trap mechanism 32) or in the vicinity of exhaust ports 28 are an exhaust valve 36 for opening and closing the exhaust passage of the exhaust pipe 30 and a pressure control valve 38 for controlling the pressure in the process apparatus or in the exhaust passage. A bypass pipe 40 with a bypass valve 42 disposed therein is connected to the gas supply pipe 20 to connect the gas supply pipe 20 with that portion of the exhaust pipe 30 which is located immediately downstream of the pressure control valve 38 (connection node P1). The bypass pipe 40 can allow the source gas, which is fed at the time of stabilizing the gas flow rate, to be supplied directly to the exhaust pipe 30 without going through process vessel 6.

A reaction-gas supply mechanism or means 44 is connected to that portion of the exhaust pipe 30 which is in the vicinity of the exhaust ports 28, more specifically, directly downstream of the connection node P1 of the bypass pipe 40 with respect to the exhaust pipe 30. Specifically, the reaction-gas supply mechanism 44 comprises a reaction-gas injection nozzle 46 whose distal end is inserted into the exhaust pipe 30 through the peripheral wall thereof, a reaction gas pipe 48 connected to the inlet of the nozzle, and a reaction gas source 50 connected to the inlet of the reaction gas pipe 48. Sequentially disposed in this reaction gas pipe 48 are a reaction gas valve 52 and a flow controller 54 which controls the flow rate of the reaction gas. $NH_3$ (ammonia) gas is used as the reaction gas that reacts with an impurity gas $TiCl_4$ gas in this example contained in the exhaust gas, to produce a compound whose vapor pressure becomes lower than that of the original gas.

The trap mechanism 32 has a housing 32B having an inlet port 32C in an upper portion of one side wall and an outlet port 32D in a lower portion of the other side wall. Multiple fins 32A, which have an ordinary temperature or are cooled by a coolant as in the exemplified case, are provided in the housing at predetermined intervals in the vertical direction. The outlet port of the pipe portion that is a part of the exhaust pipe 30 is connected to the inlet port of the housing whose outlet port is connected to the inlet port of the pipe portion that is the other portion of the exhaust pipe 30.

Tape heaters 55A, 55B and 55C are respectively wound around the gas supply pipe 20, the bypass pipe 40 and that portion of the exhaust pipe 30 which is the upstream of the trap mechanism 32 as indicated by broken lines. The heaters 55A, 55B and 55C heat the respective pipes at predetermined temperatures, thereby preventing the gas components in the pipes (passages) from being condensed and liquefied.

A description will now be given of how to deposit a film by the thus constituted process apparatus and how to remove an impurity gas by the exhaust apparatus.

At the time of depositing a Ti film, the semiconductor wafer W is placed on the susceptor 10 in the process vessel 6 and is heated to a predetermined temperature and maintained at that temperature. At the same time, a high-frequency voltage is applied between the susceptor 10 used as the lower electrode and the shower head 14 used as the upper electrode. Predetermined gases, such as $TiCl_4$ gas, $H_2$ gas and Ar gas, are fed from the shower head 14 while controlling the flow rate, thus producing the plasma in the processing space to deposit a Ti film onto the wafer W. At the same time, the exhaust apparatus 4 is driven to evacuate the process vessel 6 to keep the internal pressure at a predetermined pressure.

With the wafer size being 8 inches, for example, the process conditions are the process pressure of 665 Pa (about 5 Torr), the process temperature of about 650° C., the flow rate of the $TiCl_4$ gas of about 5 sccm, the flow rate of the $H_2$ gas of about 2000 sccm and the flow rate of the Ar gas of about 500 sccm.

To the deposition of the Ti film generally consumes approximately 10% of the $TiCl_4$ gas, and the remaining gas (about 90%) as a non-reaction gas and reaction by-products of $TiCl_2$, $TiCl_3$ and HCl are fed into the exhaust pipe 30 from the exhaust ports 28 together with the exhaust gas by the vacuum pump 33. The exhaust gas further flows down in the order of the trap mechanism 32, the vacuum pump 33 and the eliminator 34. In this case, the non-reacting TiCl4 gas, and the reaction by-products, have a relatively high vapor pressure, which are not generally possible to be sufficiently removed by the trap mechanism 32.

Figure 3:
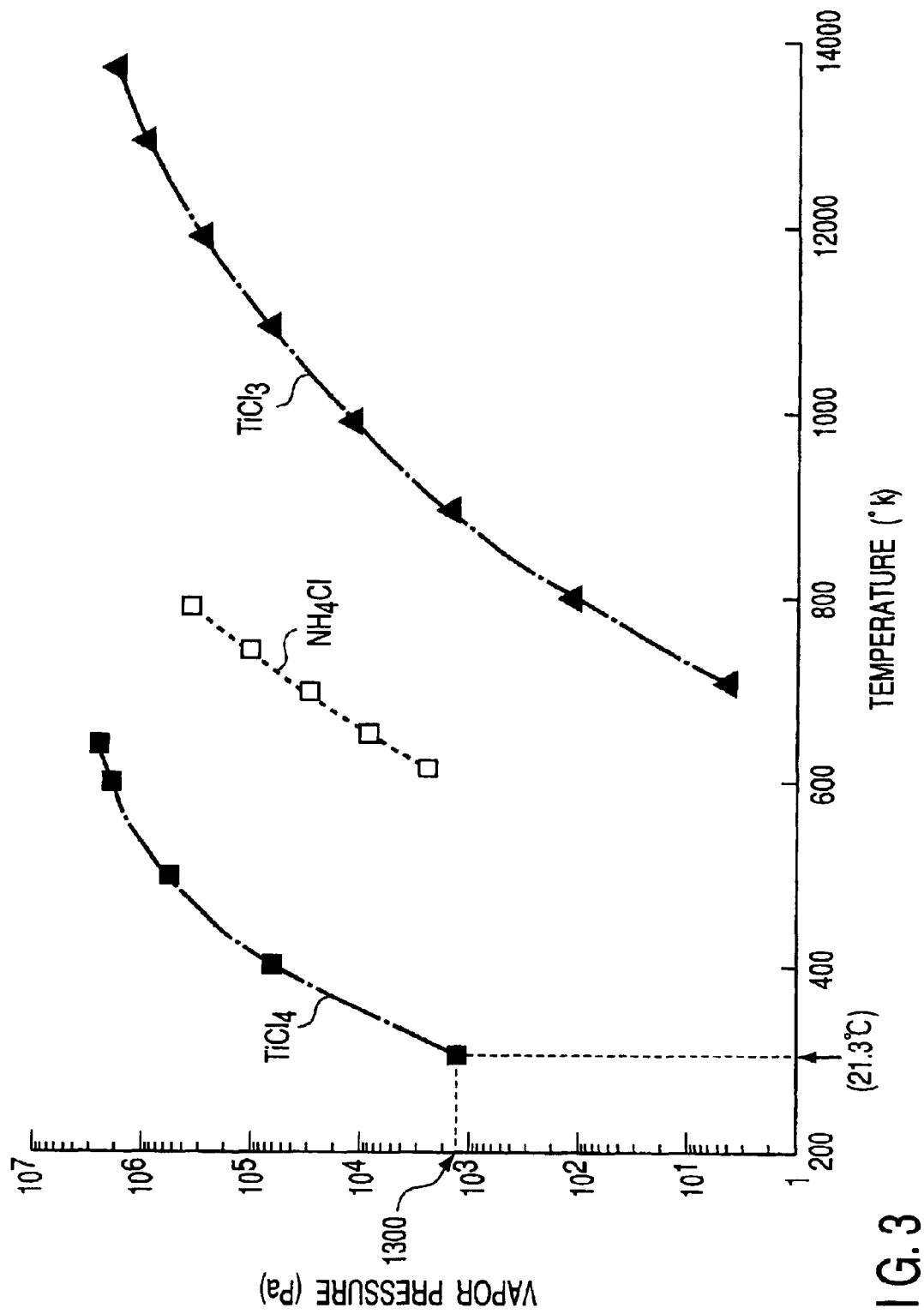
FIG. 3 is a diagram depicting vapor pressure curves of $TiCl_4$, $TiCl_3$ and $NH_4Cl$.

In this respect, the $NH_3$ gas is supplied into the exhaust pipe 30 as a reaction gas from the reaction-gas injection nozzle 46 of the reaction-gas feeding mechanism 44 in this apparatus. The $NH_3$ gas reacts mainly with the $TiCl_4$ gas in the exhaust pipe 30 at the upstream of the trap mechanism 32, forming the complex of $TiCl_4.2NH_3$. This complex has a significantly lower vapor pressure than the $TiCl_4$ gas, e.g., about $1\times10^{-4}$ Pa (not shown) at 21.3° C. in contrast to 1300 Pa for the $TiCl_4$ gas at 21.3° C. as shown in, for example, FIG. 3. The HCl gas reacts with the $NH_3$ gas and becomes an $NH_4Cl$ gas which also has a low vapor pressure as illustrated. FIG. 3 shows the vapor pressure characteristic of $TiCl_3$, too.

The non-reacted residual gas is reacted mainly with the $NH_3$ gas to be converted to a compound having a lower vapor pressure or HCl as a reaction by-product is reacted with the $NH_3$ gas to be converted to a compound having a lower vapor pressure. The residual gas easily and almost completely condenses, solidifies and traps the gas in the trap mechanism 32. In this case, the internal temperature and pressure of the trap mechanism 32 only needs to be set to such conditions based on the vapor pressure curves that a compound, such as the complex or $NH_4Cl$ gas can be condensed and solidified. With an attention given to the complex, for example, if the temperature inside the trap mechanism 32 is 21.3° C., the pressure should be set equal to or higher than $1\times10^{-4}$ Pa. The fins 32A should of course be kept at a low temperature by a coolant or the like and/or have their large contact surfaces, in order to increase the trapping yield.

Also, the other reaction by-products, such as $TiCl_2$, $TiCl_3$ and $NH_4Cl$, have lower vapor pressures than the $TiCl_4$ gas. Therefore, those by-products are trapped and removed by the trap mechanism under the aforementioned conditions. To remove the impurity gas reliably, it is preferable to feed the $NH_3$ gas of, for example, 10 sccm or greater which is twice the supply amount of the $TiCl_4$ gas of 5 sccm or greater. That is, to convert the entire $TiCl_4$ gas to the complex of $TiCl_4.2NH_3$, the amount of moles of $NH_3$ should be twice or more as great as the amount of moles of $TiCl_4$ as readily understood from the following equation.

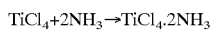

$$TiCl_4 + 2NH_3 \rightarrow TiCl_4.2NH_3$$

In other words, it is desirable that the flow rate of the reaction gas with respect to the non-reacted gas be set to such a value as to make the entire non-reacted gas react and become a complex with a low vapor pressure.

As the trapping yield of each impurity gas is improved, it becomes possible to reduce the size of the eliminator 34 located at the downstream of the trap mechanism 32, to decrease the running cost, and to elongate the service life. It is also possible to prevent the impurity gas component from being condensed inside the vacuum pump 33 and stuck there.

The reaction-gas injection nozzle 46 is provided way up in the exhaust pipe 30 to make the distance between the nozzle 46 and the trap mechanism 32 longer. The reaction gas is therefore sufficiently diffused in the exhaust gas before the exhaust gas reaches the trap mechanism 32. Thus, the reaction of the $TiCl_4$ gas can be accelerated. This can result in further improvement of the trapping yield. The portion of the exhaust pipe at the upstream of the trap mechanism 32 is heated by the tape heater 55C, to a temperature higher than the condensing temperature of the complex of $TiCl_4.2NH_3$ which has the highest vapor pressure in the compounds, e.g., about 170° C. Hence, the complex will not be condensed or clog the pipe.

Before the deposition process, the $TiCl_4$ gas or the like may be directly fed to the exhaust pipe 30 via the bypass pipe 40, without flowing into the process vessel 6, in order to stabilize the flow of the $TiCl_4$ gas or the like. In this case, the $TiCl_4$ gas can be reliably removed as mentioned earlier by flowing the $NH_3$ gas as the reaction gas into the exhaust pipe 30.

Figure 4A:
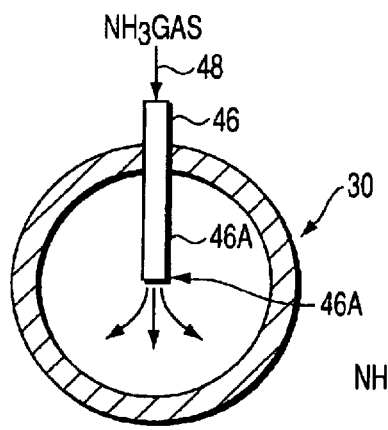
FIGS. 4A to 4C are cross-sectional views showing exhaust pipes provided with modified different injection nozzles, respectively.

According to this embodiment, the distal end 46A of the reaction-gas injection nozzle 46 is positioned slightly inward of the side wall of the exhaust pipe 30 as shown in FIG. 2. Nonetheless, for example, the distal end 46A of the reaction-gas injection nozzle 46 may be positioned approximately at the cross-sectional center of the exhaust pipe 30 as shown in FIG. 4A, thereby accelerate the diffusion of the fed reaction gas.

Figure 4B:
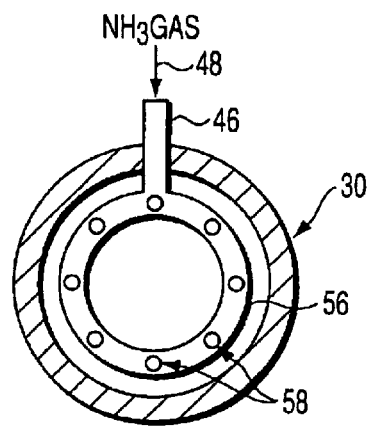

This invention is not limited to the pipe-like nozzle shape but a ring-shaped annular pipe 56 may be connected to the distal end of the nozzle 46 with multiple gas injection holes 58 provided in the pipe 56 to supply the reaction gas as shown in FIG. 4B. Further, straight pipes 60 may be provided in a cross shape to communicate with the annular pipe 56 with gas injection holes 58 provided also in the straight pipes 56 to supply the reaction gas as shown in FIG. 4C.

Figure 4C:
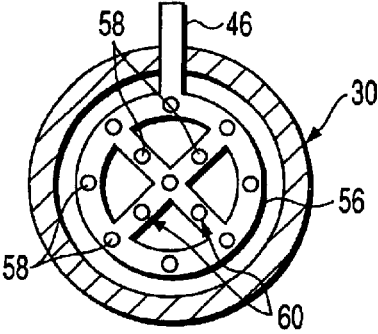

The structures as shown in FIGS. 4B and 4C can further increase the diffusion of the supplied reaction gas, thereby further improving the trapping yield.

Figure 5:
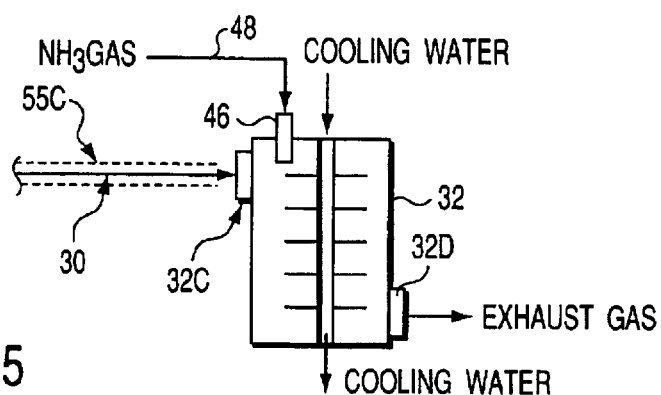
FIG. 5 is a view schematically showing a trap mechanism to which a reaction-gas injection nozzle is attached.

The reaction-gas injection nozzle 46 is provided at the relatively upstream side of the exhaust pipe 30 in the apparatus exemplified in FIG. 1. This arrangement is not restrictive. The nozzle 46 may be provided in the exhaust pipe 30 anywhere as long as the location is upstream of the trap mechanism 32 or may be provided in the trap mechanism 32 itself as shown in FIG. 5. In the case of providing the reaction-gas injection nozzle 46 in the trap mechanism 32, it is preferable to provide the nozzle as close as possible to a gas inlet ports 32C of the housing 32B of the trap mechanism 32, in order to increase the trapping efficiency.

Although the foregoing description of this embodiment has been given of the case where a Ti film is deposited by plasma CVD using the $TiCl_4$ gas, $H_2$ gas and Ar gas (for the plasma), this invention is in no way limited to this particular case. Rather, it may be adapted to the case where a TiN film is deposited by thermal CVD using, for example, the $TiCl_4$ gas and $NH_3$ gas. The latter case will be discussed later. Although the $NH_3$ gas is previously included as a source gas in this case, the $TiCl_4$ gas alone may flow in the bypass pipe without feeding the $NH_3$ gas to stabilize the flow rate of the $TiCl_4$ gas or an insufficient amount of the $NH_3$ gas in chemical equivalence may flow. In such a case, the residual $TiCl_4$ gas in the exhaust gas is reacted with the $NH_3$ gas fed into the exhaust pipe to be surely removed.

Although the foregoing description has been given of the case where the $TiCl_4$ gas is used as a high-melting point metal halogen compound gas, the same can be applied to the case where another compound gas, such as a $WF_6$, is used. This invention may be adapted to the case where the $WF_6$ gas and $NH_3$ gas are used to form a WN film, the case where the $WF_6$ gas and $SiH_4$ gas are used to form a tungsten film, and to the case where the $WF_6$ gas and $SiH_2Cl_2$ gas are used to form a WSi film.

This invention can also be adapted to the case where a $(Ta(OE)_5)_2$, a high-melting point metal organic compound gas, is used as a high-melting point metal compound gas to form a $Ta_2O_5$ film from $(Ta(OE)_5)_2$ and $O_2$.

Although $NH_3$ gas is used as a reaction gas in this example, $O_2$-containing gas (including pure oxygen) or $H_2O$ (water vapor) may be fed into the exhaust gas instead. In this case, the $TiCl_4$ gas reacts with the $O_2$-containing gas or $H_2O$ to yield a $TiO_2$ compound. The $TiO_2$ compound has a considerably low vapor pressure and is easily condensed and solidified at the heating temperature of 170° C. for the exhaust pipe 30. It is therefore desirable to directly feed the $O_2$-containing gas or water vapor in the trap mechanism 32 in the case of supplying the $O_2$-containing gas or water vapor into the exhaust gas.

A description will now be given of a method of stabilizing a reaction by-product which is produced at the time of depositing a TiN film. The method may be used at the time of stabilizing a reaction by-product which is produced at the time of depositing the aforementioned Ti film as will be discussed later.

Figure 6:
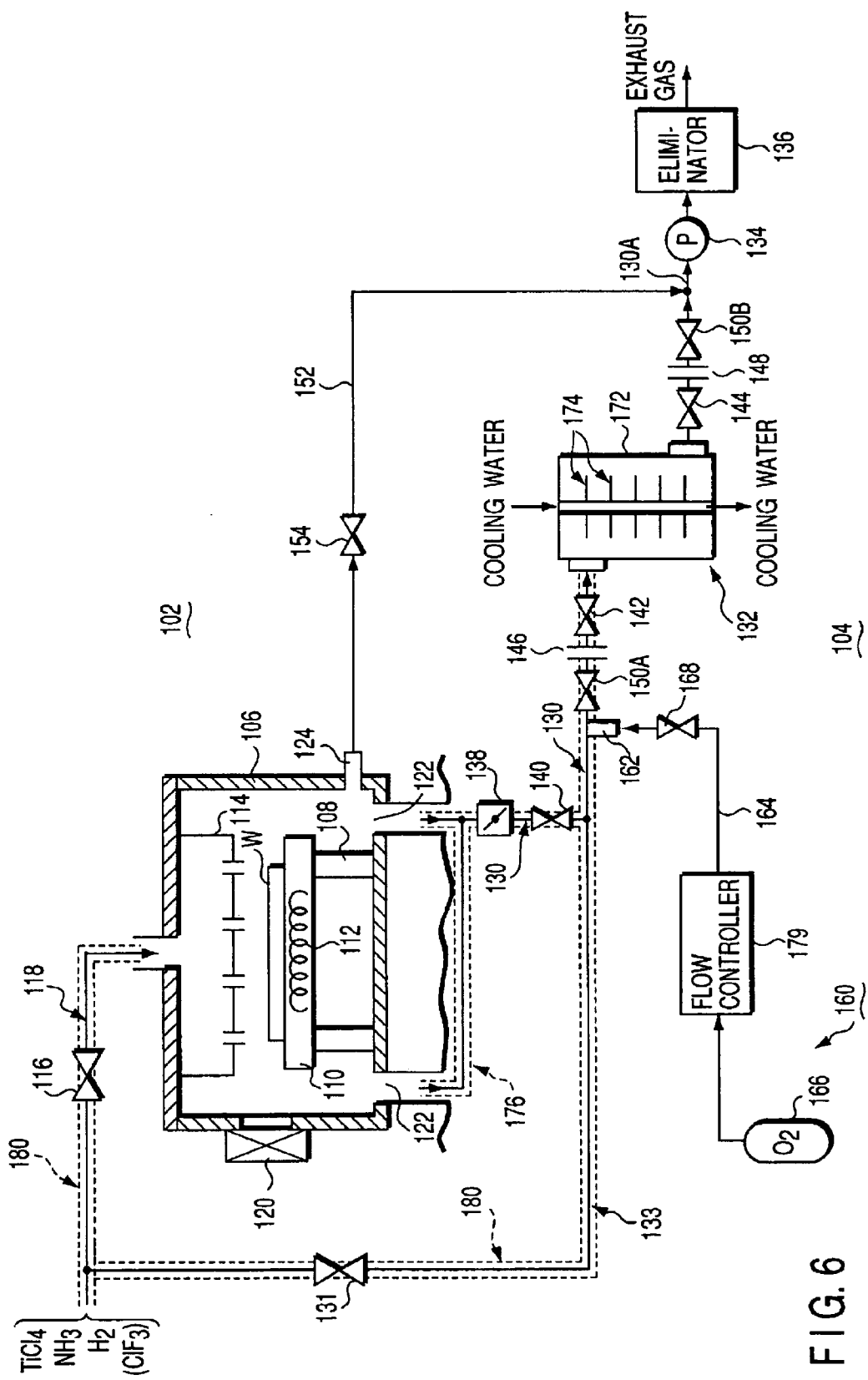
FIG. 6 is a view schematically illustrating an exhaust apparatus according to another embodiment of this invention which is combined with a process apparatus.

FIG. 6 is a structural view illustrating an exhaust apparatus for a process apparatus according to another embodiment of this invention.

The following description of this embodiment will be given of the case where a TiN film is deposited on a semiconductor wafer that is an object to be processed by CVD using a $TiCl_4$ gas (i.e., high-melting point metal halogen compound gases) as high-melting point metal compound gases and $NH_3$ gas.

As shown in FIG. 6, this film deposition system mainly comprises a process apparatus 102 which actually deposits a Ti film on a semiconductor wafer W and an exhaust apparatus 104 which evacuates the inside of the process apparatus 102.

To begin with, the process apparatus 102 will be discussed. This process apparatus 102 has a cylindrical process container 106 of, for example, aluminum. Provided in the process vessel 106 is a susceptor 110 which is supported on the bottom of the vessel by support columns 108 and on which the semiconductor wafer W is to be placed an held. The susceptor 110 is made of ceramics, such as aluminum nitride, and a resistance heating 112 for heating the semiconductor wafer W is embedded in the susceptor 110.

A shower head 114 which feeds a necessary gas, such as a source or process gas, into the process vessel 106 is provided on the ceiling portion of the process vessel 106. A gas supply pipe 118 which has a supply-side valve 116 disposed therein is connected to the shower head 114 so that necessary gases, such as $TiCl_4$ gas, $NH_3$ gas and $H_2$ gas, or $ClF_3$ gas used as a cleaning gas can be supplied into the process vessel 106 with their flow rates controlled. The individual gases may be supplied from independent supply pipes. Note that the $N_2$ gas can be used as a carrier gas for the $TiCi_4$ gas or can be fed alone as needed.

A gate valve 120 through which the loading and unloading of the wafer W are carried out is provided in the side wall of the process vessel 106 and exhaust ports 122 and a bypass exhaust port 124 are provided in the lower portions of the process vessel 106.

The exhaust apparatus 104 that is connected to the process apparatus 102 with the above-described structure has an exhaust pipe 130 of stainless with an inner diameter of about 10 cm, which has one end connected to the exhaust ports 122. A trap mechanism 132 for removing an impurity gas in the exhaust gas, a vacuum pump 134 which evacuates the process vessel 106 and an eliminator 136 which completely eliminates the residual impurity gas in the exhaust gas are disposed in order in the exhaust pipe 130 in the downstream direction.

Disposed at the topmost stream side of the exhaust pipe 130 are a pressure control valve 138 which controls the pressure in process apparatus or in the exhaust passage of the exhaust pipe 130 and a first exhaust valve 140 for opening and closing the exhaust pipe 130. A bypass pipe 133 containing a bypass valve 131 is connected between the exhaust pipe 130 directly downstream of the first exhaust valve 140 and the gas supply pipe 118, in order to permit the gas to bypass the process vessel 106 as needed.

Valves 142 and 144 which are closed at the time of sealing the trap mechanism 132 airtight are provided directly upstream and downstream of the trap mechanism 132. An upstream flange joint 146 and downstream flange joint 148, which are joined at the time of connecting the trap mechanism 132 to the exhaust pipe 130, are provided directly upstream and downstream of those valves 142 and 144.

Second exhaust valves 150A, 150B are provided between the nozzle 162 and the upstream flange joint 146, and the downstream flange joint 148 and the vacuum pump 134 respectively. An exhaust bypass pipe 152 having a bypass valve 154 disposed therein is provided to communicate the bypass exhaust port 124 of the process container 106 with the portion 130A or the exhaust pipe 130 directly downstream of the second exhaust valve 150B. The inner diameter of the exhaust bypass pipe 152 is, for example, 20 mm, significantly smaller than the inner diameter of the exhaust pipe 130 which carries out main exhaust. The process container 106 can be therefore evacuated with a large inverse diffusion coefficient as will be discussed later.

Oxidative-gas feeding means 160 is connected to that portion of the exhaust pipe 130 which is located directly downstream of the first exhaust valve 140. Specifically, this oxidative-gas supply means 160 comprises a gas injection nozzle 162 whose distal end is inserted into the exhaust pipe 130 through the peripheral wall thereof, an oxidative gas pipe 164 connected to the nozzle 162, and an oxidative gas source 166. The gas injection nozzle 162 and the exhaust pipe 130 may be those illustrated in FIGS. 4A, 4B and 4C may be used. An oxidative gas valve 168 and a flow controller 179, which controls the flow rate of the oxidative gas are disposed in order in the oxidative gas pipe 164. Any gas which oxidizes and stabilizes a reaction by-product can be used as the oxidative gas. Although the $O_2$ gas is used in this embodiment, another gas, such as $O_3$ (ozone), a gas containing dry-air $O_2$ or $H_2O$ (water vapor), can be used as well. The nozzle 162 may be provided in the trap mechanism 132 so as to directly feed the oxidative gas into the trap mechanism 132.

Multiple fins 174 which have an ordinary temperature or are cooled by a coolant as in the illustrated case are provided inside a housing 172 of the trap mechanism 132. A reaction by-product or the like sticks on those fins 174 and is trapped there. A tape heater 176 is wound around the portion of the exhaust pipe 130 which is located upstream of the trap mechanism 132, as indicated by the broken lines, to heat the pipe 130 to a predetermined temperature. This prevents the gas components from being condensed and liquefied inside the pipe. Likewise, a tape heater 180 for preventing the liquefaction of the source gas is put around the gas supply pipe 118 and the bypass pipe 133.

Referring to embodiment of FIGS. 7 and 8, a description will now be given of how to deposit a film by the thus constituted process apparatus and how to remove an impurity gas by the exhaust apparatus.

At the time of depositing a TiN film, the semiconductor wafer W is placed on the susceptor 110 in the process container 106 and is heated to a predetermined temperature and maintained at that temperature. At the same time, predetermined process gases, such as the $TiCl_4$ gas, $NH_3$ gas and $N_2$ gas are fed from the shower head 114 under the flow-rate control and are reacted with the impurity gas in the processing space, thereby depositing a TiN film. At the same time, the exhaust apparatus 104 is driven to vacuum the interior of the process vessel 106 to keep the internal pressure at a predetermined pressure.

For example, in the case of the wafer size being 8 inches, for example, the process conditions here are the process pressure of 39.9 Pa (about 0.3 Torr), the process temperature of about 680° C., the flow rate of the $TiCl_4$ gas of about 30 sccm, the flow rate of the $NH_3$ gas of about 400 sccm and the flow rate of the $N_2$ gas of about 340 sccm.

The deposition-reaction of the TiN film causes $NH_4Cl$, $TiCl_4(NH_3)_n$ gas and the like to flow as reaction by-products together with the exhaust gas into the exhaust pipe 130 from the exhaust ports 122. Therefore, the exhaust gas further flows down in the order of the trap mechanism 132, the vacuum pump 134 and the eliminator 136. Further, the non-reacted $TiCl_4$ gas also flows down together with the exhaust gas. Most of the non-reacted gas and reaction by-product gas are cooled to be solidified by the trap mechanism 132 and removed by this trap mechanism 132.

The impurity gas that cannot be removed by the trap mechanism 132 flows downstream to be almost surely removed by the eliminator 136, making the exhaust gas harmless.

When film deposition on a certain number of wafers is completed, undesirable films, which are to produce particles, are deposited on the inner wall of the process vessel 106 and the surface or the like of the susceptor 110. Cleaning is preferably executed regularly irregularly to remove the undesirable films. In this case, for example, a $ClF_3$ gas is used as the cleaning gas, the susceptor 110 is heated and kept at, for example, 250° C. and the process container 106 is evacuated while this gas is kept supplied into the process container 106 from the shower head 114 in order to increase the cleaning efficiency. At this time, the $ClF_3$ gas that flows inside the trap mechanism 132 reacts with $TiCl_4(NH_3)_n$ that is trapped there, thus producing $TiF_4(NH_3)$ as a reaction by-product.

As the film deposition and the cleaning process are repeated by the proper number of times this way, reaction by-products are gradually accumulated in the trap mechanism 132 as mentioned earlier. It is therefore necessary to detach the trap mechanism 132 from the exhaust system and clean out the reaction by-products.

If the trap mechanism 132 is exposed to the air or atmosphere without doing the necessary processing, the reaction by-product contacts the air, causing the reactions given in the equations (1) and (2). Impurity gases harmful to human bodies are undesirably generated from the reaction by-products. According to this embodiment, therefore, the $O_2$ gas, for example, is made to flow in the trap mechanism 132 as the oxidative gas to cause the reactions given in the formulas (1) and (2) before the trap mechanism 132 is detached from the exhaust system. The trap mechanism 132 is detached from the exhaust system when the reaction by-products are stabilized. One example of the stabilization of the reaction by-products will be discussed specifically referring to FIG. 7.

When the cleaning process following the deposition process is completed, the supply of the deposition gas and cleaning gas is stopped and evacuation continued, while maintaining the rotation speed of the vacuum pump 134 at an appreciated value (S1). The temperature of the susceptor 110 may be lowered to room temperature. It takes much time to lower the temperature, which would reduce the throughput. To avoid a throughput reduction, $N_2$ gas is fed into the process vessel 106 at a predetermined rate (S3), while keeping the temperature of the susceptor 110 at the process temperature or while first lowering the temperature to an idling temperature higher than the room temperature and then maintaining it at the idling temperature (S2). The $N_2$ gas is made to flow this way, in order to expel the unnecessary metal component or gas component emanating from the wall of the process vessel or the susceptor 110 at high temperature.

Next, the first exhaust valve 140 of the exhaust pipe 130 is closed, blocking the exhaust pipe 130, and the bypass valve 154 of the exhaust bypass pipe 152 is opened, opening the exhaust bypass pipe 152 (S4). As a result, the vacuum pump 134 forces the $N_2$ gas out of the process vessel 106 via the exhaust bypass pipe 152 whose inside diameter is smaller than that of the exhaust pipe 130.

With this state maintained, the oxidative gas valve 168 on the oxidative gas pipe 164 is opened, feeding the oxidative gas or the $O_2$ gas to the exhaust pipe 130 at a predetermined flow rate (S5). As the $O_2$ gas further flows down in the trap mechanism 132 by vacuum, it contacts the reaction by-product trapped in the trap mechanism 132, causing reactions of the formulas (1) and (2) and stabilizing the by-products. That is, $TiCl_4(NH_3)_n$ and $TiF_4(NH_3)_n$ react with $O_2$ (the formulas (1) and (2)), generating $TiO_2$, HCl, HF and $NH_3$ gases $TiO_2$ is a stable compound and fixed inside the trap mechanism 132, whereas HCl, HF and $NH_3$ flow down in a gaseous form and are made harmless in the eliminator 136. At this time, the pressure in the trap mechanism 132 is about 665 Pa (about 5 Torr). The reaction by-product is stabilized over a predetermined and sufficient time, e.g., for several hours (S6). Then, the oxidative gas valve 168 is closed to stop feeding the $O_2$ gas to the trap mechanism 132 (S7).

Next, the second exhaust valves 150A, 150B at the near the trap mechanism 132 are closed (S8), and both valves 142 and 144 at the upstream of the trap mechanism 132 are closed, sealing the trap mechanism 132 airtight and isolate it (S9).

Then, both flange joints 146 and 148, which connect the trap mechanism 132 to the exhaust system, are unfastened. The trap mechanism 132 is detached from the exhaust pipe 130 (S10). In this state, $N_2$ gas is supplied into the process vessel 106 and evacuation is carried out via the exhaust bypass pipe 152 as mentioned earlier. Then, the trap mechanism 132 is released at a predetermined location, removing $TiO_2$ or the like out of the trap mechanism 132 (S11). At this time, the reaction by-product has been oxidized, forming $TiO_2$ or the like. $TiO_2$ or the like is stable substance. Thus, impurity gas harmful to human bodies is hardly generated when the trap mechanism 132 is released.

As described above, the oxidative gas is supplied into the trap mechanism 132 to oxidize and stabilize the trapped reaction by-product before the trap mechanism 132 is detached from the exhaust pipe 130 in this embodiment. It is therefore possible to safely clean the inside of the trap mechanism 132 detached.

If the oxidative gas flows reversely and enters the process vessel 106, it will affect the precoat film stuck on the wall or the like of the process vessel 106. In embodiment, however, the process vessel 106 is evacuated at a large inverse diffusion coefficient via the exhaust bypass pipe 152 while the oxidative gas is being supplied. This can prevent the counterflow of the oxidative gas into the process container 106. The trap mechanism 132 can therefore be removed and cleaned, with the susceptor 110 heated. The throughput is thereby improved.

The inverse diffusion coefficient of the exhaust bypass pipe 152 will be discussed.

It is empirically proved that if the Peclet number Pe in the exhaust bypass pipe 152 is 10 or more during the aforementioned processing, the oxidative gas is hardly diffused reversely and hardly flows reversely into the process vessel 106. The Peclet number Pe is a dimensionless value called "inverse diffusion coefficient." It is given by the following equation.

$$Pe=Vs \cdot Ls/D$$

where Vs is the flow velocity of the gas in the exhaust bypass pipe 152, Ls is the length of the exhaust bypass pipe 152 and D is a diffusion constant (mutual diffusion). In this embodiment, the length and the inside diameter of the exhaust bypass pipe 152 may be respectively about 2.5 m and about 20 mm. If so, Pe is approximately 170, much greater than "10," which would reliably inhibit the counterflow of the oxidative gas 106 into the process container 106.

Although stabilization of the reaction by-product is performed by feeding $O_2$ gas for a predetermined time, e.g., for several hours, under the pressure of, for example, 665 Pa, this case is not restrictive. Also, as shown in FIG. 8, the step of temporarily trapping the oxidative gas in the trap mechanism under pressure, and the step of discharging the gas may be repeatedly performed. The steps S21 to S26 illustrated in FIG. 8 replace the steps FIG. 7.

Figure 7:
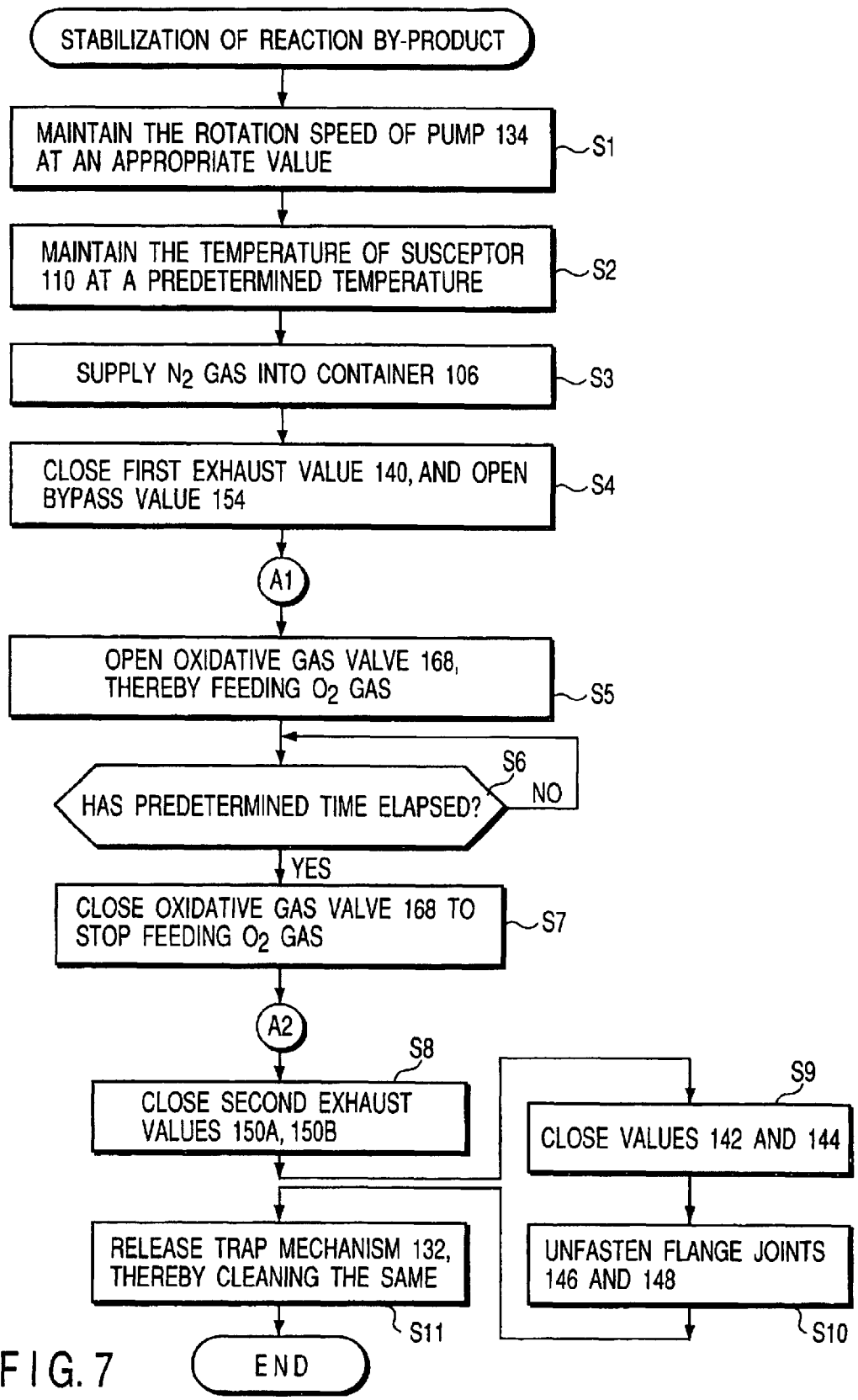
FIG. 7 is a flow illustrating one example of an impurity-gas removing method of this invention.
Figure 8:
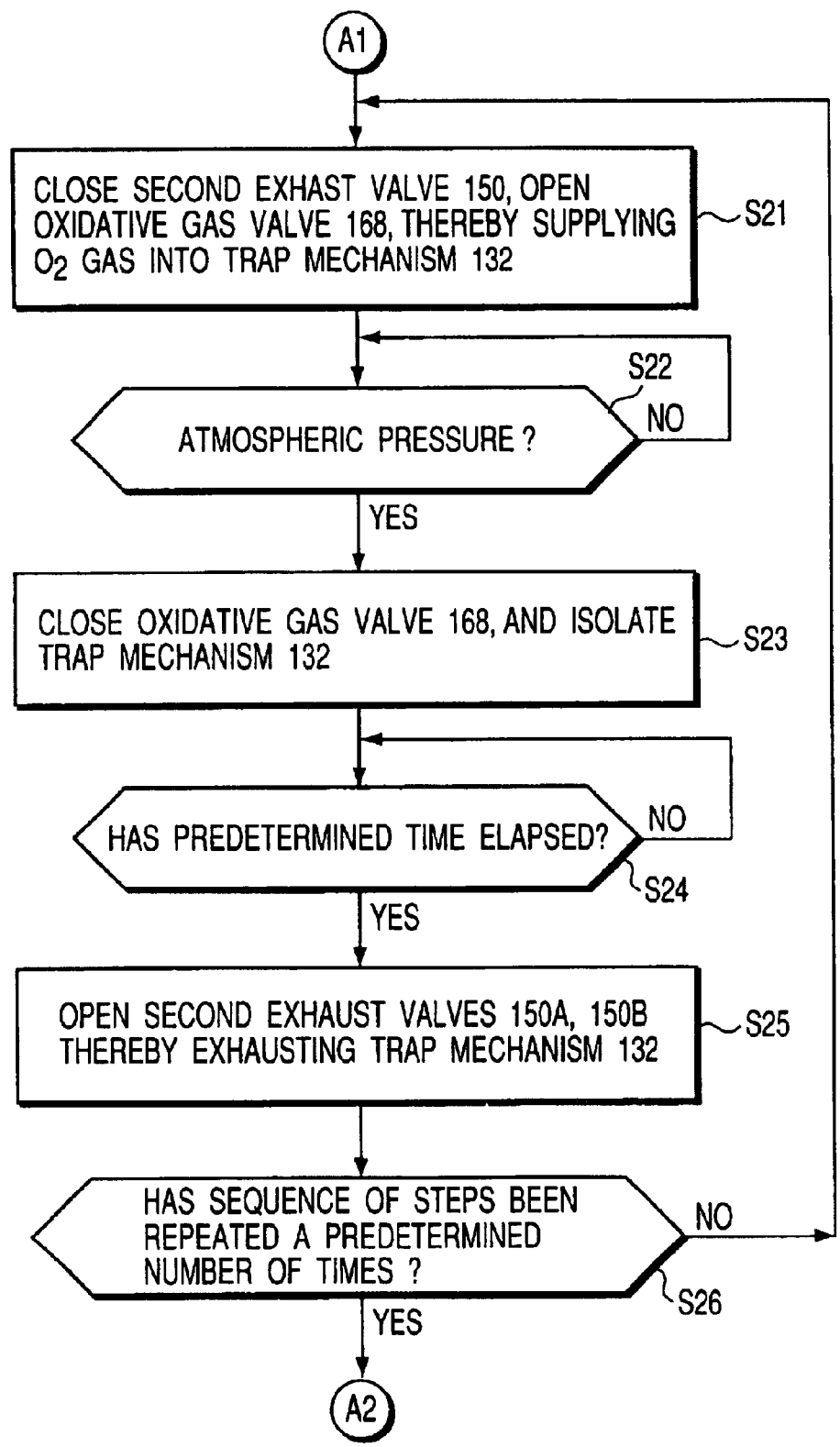
FIG. 8 is a flow illustrating another example of the impurity-gas removing method of this invention.

When the step shown in S4 in FIG. 7 is completed, i.e., when the first exhaust valve 140 is closed and the bypass valve 154 is opened, the second exhaust valve 150 is closed and the oxidative gas valve 168 is opened, supplying the $O_2$ gas into the trap mechanism 132. The $O_2$ conditions are, for example: the outside temperature of 25° C., the supply pressure of 0.1 Mpa, the flow rate of $O_2$ gas of 25 l/m and the temperature of $O_2$ of 5° C. to 30° C.

Note that the downstream valve 144 may be closed, instead of closing the second exhaust valve 150B.

The $O_2$ gas is enclosed in the trap mechanism 132 until the pressure in the mechanism 132 changes to a predetermined pressure, e.g., the atmospheric pressure (S22). When the pressure in the trap mechanism 132 changes to the atmospheric pressure, the oxidative gas valve 168 is closed to stop feeding the $O_2$ gas and isolate the trap mechanism 132 (S23). The upstream valve 142 may be closed, instead of closing the oxidative gas valve 168.

As the $O_2$ gas is kept locked in the trap mechanism 132 for a predetermined time under a pressure higher than the pressure needed for evacuation or under the atmospheric pressure, the oxidation stabilization of the reaction by-product in the trap mechanism 132 is accelerated more than that in the case where the $O_2$ gas is simply fed.

When trapping for a predetermined time, e.g., about 20 to 40 minutes, is completed (YES in S24), the second exhaust valves 150A, 150B are opened to discharge the impurity gas component produced from the trap mechanism 132 over a predetermined time (about 20 minutes) (S25). At this time, the oxidative gas valve 168 may be opened to let the $O_2$ gas flow to accelerate the discharging of the impurity gas. The steps of S21 to S25 are repeatedly performed until a sequence of steps from A1 in the flow up to the present point is repeated a predetermined number of times (NO in S26). In each repeated sequence of steps, the $O_2$ gas may be included des in the trap mechanism 132 for the same time or a different time. For example, the time may be set longer as the number of repetitions increases. When the sequence of the steps is repeated a predetermined number of times, the flow goes to step S8 in FIG. 7.

The oxidative gas is locked in the trap mechanism 132 under a pressure higher than the one needed for evacuating the trap mechanism or and is discharged from the mechanism 132 several times. The reaction by-product can therefore be stabilized quickly. The $O_2$ gas remains locked in the trap mechanism 132 for a predetermined time (FIG. 8). Nonetheless, this invention is not limited to this particular case. Rather, the $O_2$ gas may be discharged immediately without waiting for a predetermined time.

The reaction by-product is stabilized with the susceptor 110 heated and the trap mechanism is cleaned, in order to improve the throughput in this embodiment. This mode is not restrictive, nevertheless. The aforementioned sequence of operations may be performed after the susceptor 110 is completely cooled down to the room temperature.

The trap mechanism 132 can be detached from the exhaust system and cleaned, after the reaction by-product is stabilized. This invention is not limited to this mode. The normal film deposition may be effected immediately, without detaching the trap mechanism 132 after the reaction by-product is stabilized. In this case, the stabilization of the reaction by-product with the supplied $O_2$ gas can reduce the volume of the contents in the trap mechanism 132. This increases the detachment and cleaning cycle of the trap mechanism 132, thus elongating the life of the trap mechanism 132.

A TiN film is deposited in the embodiment described above. This technique may be applied to form a Ti film accommodated by using $TiCl_4$ gas and $H_2$ gas. In this case, surface nitriding process is particularly, performed with the supplied $NH_3$ gas after deposition of the Ti film, so that the same chemical reaction as described above may occur.

While description has been made of the case where the $TiCl_4$ gas is used as a high-melting point metal halogen compound gas, this invention can be applied to the case where another compound gas, such as $WF_6$, is used. This invention may be adapted to the case of forming a WN film by using the $WF_6$ gas and $NH_3$ gas, the case of forming a tungsten film by using the $WF_6$ gas and $SiH_4$ gas, and the case of forming a WSi film by using the $WF_6$ gas and $SiH_2Cl_2$ gas.

If a $(Ta(OE)_5)_2$ (pentoethoxy tantalum) or a high-melting point metal organic compound gas is used as a high-melting point metal compound gas, the invention can also be adapted to the case of forming a $Ta_2O_5$ film from $(Ta(OE)_5)_2$ and $O_2$.

As shown in FIG. 9, the oxidative-gas supply means 160, which comprises the oxidative gas source 166, oxidative gas pipe 164 and gas injection nozzle 162, may be connected to the exhaust pipe 30 of the exhaust apparatus 4 or the trap mechanism 32, both shown in FIG. 1. (Although the oxidative-gas feeding means 160 is connected to the exhaust pipe 30 in the illustrated example, the gas injection nozzle 162 may be provided directly on the trap mechanism 32 in the manner shown in FIG. 5.) In this case, it is also preferred that the exhaust bypass pipe 152 having the bypass valve 154 disposed therein be connected to the bypass exhaust port 124 formed in the process vessel 6 and a portion directly upstream of the vacuum pump 33. The description of the opening/closing valves is omitted. This structure can oxidize and stabilize the reaction by-product in the trap mechanism 32, which has been produced by reaction with the $NH_3$ gas supplied from the reaction-gas supply means 44.

Although description of the individual embodiments has been made of the case where a semiconductor wafer is used as an object to be processed, the invention is not limited to this case. It may be adapted to the case where the object to be processed is a glass substrate, LCD substrate or the like.

As described above, the exhaust apparatus for a process apparatus and the impurity-gas removing method according to this invention have the following advantages.

According to one aspect of the invention, as the reaction gas from the reaction-gas supply means is fed into the trap mechanism or the exhaust pipe at the upstream of the trap mechanism, the reaction gas reacts with the impurity gas in the exhaust gas and becomes a reaction by-product whose vapor pressure is lower than that of the reaction gas. It is therefore possible to easily condense and solidification the impurity gas in the trap mechanism and trap the gas there.

According to another aspect of the invention, mixed diffusion of the reaction gas is accelerated while the exhaust gas reaches the trap mechanism. This accelerates the reaction accordingly, making it possible to more surely trap and eliminate an impurity gas such as a high-melting point metal compound gas.

According to a different aspect of the invention, it is possible to oxidize and stabilize an unstable reaction by-product by feeding an oxidative gas to the exhaust system before the trap mechanism is detached from the exhaust system. This makes it possible to remove the trap mechanism from the exhaust system and clean the inside of the trap mechanism while safely keeping the trap mechanism open.

According to an yet further aspect of the invention, it is possible to oxidize and stabilize an unstable reaction by-product by feeding an oxidative gas to the exhaust system before the trap mechanism is detached from the exhaust system. This makes it possible to remove the trap mechanism from the exhaust system and clean the inside of the trap mechanism while safely keeping the trap mechanism open.

According to a still further aspect of the invention, it is possible to prevent the reverse diffusion of the oxidative gas to the process apparatus. A precoat film or the like formed on the inner wall or the like of process container of the process apparatus, for example, can therefore be prevented from being altered by the oxidative gas.

According to an yet still further aspect of the invention, because the oxidative gas is locked inside the trap mechanism under a pressure higher than the pressure involved at the time of vacuuming the trap mechanism, the reaction of the reaction by-product with the oxidative gas is accelerated, thus ensuring faster stabilization of the reaction by-product.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for removing impurities out of an exhaust gas discharged from a chamber used for depositing metallic films on objects, comprising:

discharging the exhaust gas containing impurities generated from a process selected from the group consisting of: (i) a process for depositing TiN on an object by using $TiCl_4$, (ii) a process for depositing WN on an object by using $WF_6$, (iii) a process for depositing W on an object by using $WF_6$, (iv) a process for depositing WSi on an object by using $WF_6$ and (v) a process for depositing $Ta_2O_5$ on an object by using pentoethoxy tantalum;

injecting a reactant gas selected from the group consisting of an oxygen-containing gas, water and ammonia into the exhaust gas, wherein the reactant gas reacts with the impurities to form reaction by products which have a lower vapor pressure than the vapor pressure of the impurities, and passing the reaction by product-containing gas through a condenser, wherein the reaction by-products are condensed out of the exhaust gas.

2. A method for removing an impurity gas discharged from a process apparatus used for processing objects by using a process gas, comprising:

evacuating an interior of the process apparatus, thereby drawing the impurity gas through an exhaust pipe connecting the process apparatus and a trap mechanism;

mixing a reaction gas to react with the impurity gas within the exhaust pipe at a location between the process apparatus and the trap mechanism to convert the impurity gas to reaction by-products having a lower vapor pressure than that of the impurity gas; and controlling a temperature of the trap mechanism to condense the reaction by-products so that the trap mechanism traps the condensed reaction by-products.

3. The impurity gas removing method according to claim 2, wherein said reaction gas is the same as a gas contained in the process gas.

4. The impurity gas removing method according to claim 2, wherein a supply amount of said reaction gas mixed with the impurity gas is at least twice that of the impurity gas.

5. The impurity gas removing method according to claim 2, wherein said process gas includes $TiCl_4$, and said reaction gas includes $NH_3$.

6. The impurity gas removing method according to claim 2, wherein said process gas includes $WF_6$, and said reaction gas includes $NH_3$.

7. A method for removing impurity gas discharged from a process apparatus used for processing objects by using a process gas, comprising:

evacuating an interior of the process apparatus and a trap mechanism;

condensing the impurity gas so that the condensed impurities are trapped in the trap mechanism; and contacting an oxidative gas with the condensed impurities trapped in the trap mechanism to oxidize the condensed impurities, thereby stabilizing the condensed impurities.

8. The impurity gas removing method according to claim 7, when said oxidative gas is made to contact said condensed impurities in said trap mechanism, said process apparatus is evacuated with an inverse diffusion coefficient by an exhaust bypass pipe by a pump provided to bypass said trap mechanism, the inverse diffusion coefficient being set so that the oxidative gas is prevented from being introduced into the process apparatus through the exhaust bypass pipe.

9. The impurity gas removing method according to claim 7, wherein said oxidative gas is contacted at a pressure higher than that needed at a time of evacuating said trap mechanism and the contacting and evacuating of the oxidative gas is repeated a plurality of times.

10. The impurity gas removing method according to claim 7, wherein said reaction by-product is a product produced as a cleaning gas reacts with a by-product of a film deposition gas.

11. The impurity gas removing method according to claim 7, wherein said process gas is one of a titanium-containing gas, tungsten-containing gas, tantalum-containing gas and silicon-containing gas.

12. The impurity gas removing method according to claim 7, wherein said oxidative gas comprises an oxygen-containing gas.

* * * * *